United States Patent [19]

Habu

[11] Patent Number: 5,485,803
[45] Date of Patent: Jan. 23, 1996

[54] METHOD OF PREDICTING CRYSTAL QUALITY OF SEMICONDUCTOR SINGLE CRYSTAL AND APPARATUS THEREOF

[75] Inventor: Ryuichi Habu, Kawasaki, Japan

[73] Assignee: Nippon Steel Corporation, Tokyo, Japan

[21] Appl. No.: 302,722

[22] PCT Filed: Jan. 6, 1994

[86] PCT No.: PCT/JP94/00006

§ 371 Date: Sep. 2, 1994

§ 102(e) Date: Sep. 2, 1994

[87] PCT Pub. No.: WO94/16124

PCT Pub. Date: Jul. 21, 1994

[30] Foreign Application Priority Data

Jan. 6, 1993 [JP] Japan ................... 5-016771

[51] Int. Cl.$^6$ ................... C30B 15/20
[52] U.S. Cl. ............... 117/14; 117/38; 117/932; 437/8
[58] Field of Search ............... 117/14, 38, 932; 437/8

[56] References Cited

U.S. PATENT DOCUMENTS

| | | | |
|---|---|---|---|
| 4,344,815 | 8/1982 | Cazarra et al. | 117/15 |
| 5,386,796 | 2/1995 | Fusegawa et al. | 117/14 |

FOREIGN PATENT DOCUMENTS

| | | |
|---|---|---|
| 58-30279 | 6/1983 | Japan . |
| 60-97619 | 5/1985 | Japan . |
| 63-112488 | 5/1988 | Japan . |
| 2-233583 | 9/1990 | Japan . |

OTHER PUBLICATIONS

Morozov et al, "Use of Precision Density and Lattice Parameters Measurements for Study . . . " Jour. of Crystal Growth vol. 75 (1986) pp. 491–496.

Applied Physics 59 (19909), T. Abe, p. 272.

The Mechanism of Swirl Defects Formation in Silicon, V. Voronkov, Journal of Crystal Growth 59 (1982) pp. 625–643.

Point Defects, Diffusion Processes, and Swirl Defect Formation in Silicon, T. Tan et al., Appl. Phys. A 37, 1–17 (1985).

Numerical Modeling of the Point Defect Aggregation during the Czochralski Silicon Crystal Growth, W. Wijaranakula, J. Electrochem Soc., vol. 139, No. 2, Feb. 1992, p. 604.

Current Problems of Defects in Semiconductors–Interaction of Defects with Impurities, K. Sumino, Materials Science Forum, vol. 105–110 (1992) pp. 139–159.

Oxygen Precipitation Mechanism in CZ Silicon, N. Inoue et al., Appl. Phys. vol. 48, No. 12 (1979) pp. 1126–1141.

*Primary Examiner*—Robert Kunemund
*Attorney, Agent, or Firm*—Pollock, Vande Sande & Priddy

[57] ABSTRACT

A method of and an apparatus for predicting density and distribution of crystal defects those would appear in a semiconductor wafer in the course during heat treatment thereof on the basis of respective densities and distributions of interstitial atoms and atom vacancies frozen, during crystal growth, into a semiconductor single crystal which is used as a raw material of said semiconductor wafer, in a section of said semiconductor single crystal corresponding to said semiconductor wafer, comprising: deriving said respective densities and distributions of interstitial atoms and atom vacancies from a first diffusion equation representing a change with time in concentration of interstitial atoms in the semiconductor single crystal in the course of growth from a melt as a function of a position in the crystal and a second diffusion equation representing a change with time in concentration of atom vacancies in said crystal as a function of a position in the crystal.

2 Claims, 5 Drawing Sheets

← 125mm →

100 μm

☐ $E_{breakdown} \geq 7.5 MV/cm$

▨ $E_{breakdown} < 7.5 MV/cm$

METHOD OF PREDICTING CRYSTAL QUALITY OF SEMICONDUCTOR SINGLE CRYSTAL AND APPARATUS THEREOF

TECHNICAL FIELD

The present invention relates to a method of and an apparatus for predicting, in a CZ (Czochralski) method or a FZ (floating zone) method of growing a semiconductor single crystal from a melt of a semiconductor material, especially growing a silicon single crystal from a silicon melt, on the basis of temperature distribution in the crystal and crystal growth rate, distribution and density of crystal defects which would appear in a silicon wafer made by slicing the silicon single crystal in the course of heat treatment process.

BACKGROUND ART

As for a dislocation free, silicon single crystal grown by pulling from a silicon melt by means of a CZ method or a FZ method, it has been hitherto known that swirl defects and D-defects (in case of FZ crystal) or phenomena such as ring-shaped OSF defects, abnormal oxide precipitation, and degradation in breakdown voltage of an oxide film (in case of CZ crystal) occur in the course of heat treatment process of a wafer, depending upon the crystal pulling condition or crystal pulling apparatus condition as described by Takao Abe, in Applied Physics, 59 (1990), p. 272. Any of these defects and the phenomena affect quality of a silicon wafer used as a substrate for highly integrated ICs.

Distribution and density of these defects in a silicon single crystal grown from a melt largely depend on the pulling condition of the crystal. Therefore, it has been considered that occurrence of these defects is determined at the time of crystal pulling. Therefore, these crystal defects are named generically "crystal defects determined during the crystal growth to occur" or "grown-in defects."

The grown-in defects provide a ring-shaped or disk-shaped macroscopic distribution in a section perpendicular to the growth axis of the crystal. It has been an important subject of research in the pulling technique of CZ and FZ silicon single crystals for a long time to elucidate the generation mechanism of the macroscopic shape.

As for such grown-in defects, it has been a dominant view that point defects such as interstitial atoms and atom vacancies taken into the crystal from the crystal growth interface during the crystal growth become thermally superfluous, agglomerate, and form nuclei of the grown-in defects as described by Takao Abe, in "Applied Physics," 59 (1990), p. 272. Therefore, it has been considered that the peculiar distribution shape of grown-in defects can be explained in terms of diffusion of interstitial atoms and atom vacancies and reaction between interstitial atoms and atom vacancies in the silicon crystal in the course of crystal pulling. (See V. V. Vronkov, J. Cryst. Growth, 59 (1982), p. 625; T. Y. Tan and U. Gosel, Appl. Phys. A37 (1985), p. 1; and W. Wijiaranakula, J. Electrochem. Soc., 139 (1992), p. 604.) In the existing circumstances, however, the diffusion equation of interstitial atoms and atom vacancies capable of determining on the basis of crystal growth condition, the shape in distribution of grown-in defects observed in CZ and FZ silicon crystals has not yet been established as pointed out by K. Sumino, in Materials Science Forum, Vol. 105–110 (1992) Pt. 1, pp. 139–160, EDs. Zs Kajcsos & Cs Szeles, Trans. Tech. Publications.

DISCLOSURE OF INVENTION

Therefore, an object of the present invention is to provide a method of and an apparatus for logically predicting, in the production process for fabricating a silicon wafer for semiconductor from a dislocation free, silicon single crystal grown from a melt, on the basis of actual data indicating the temperature distribution in the crystal and crystal growth rate in the course of crystal pulling, distribution of grown-in defects which would appear in wafer during a heat treatment.

The present inventor has experimentally found that uphill diffusion of interstitial atoms and atom vacancies toward the crystal growth interface, which depends on the temperature gradient existing in the crystal during crystal growth, occurs dominantly during crystal growth as compared with ordinary diffusion of interstitial atoms and atom vacancies, which depends on the concentration gradient of them.

Furthermore, the present inventor has succeeded in establishing formulas including diffusion of two kinds of point defects, i.e., interstitial atoms and atom vacancies existing in silicon during crystal growth and pair annihilation reaction between those point defects. The equations thus obtained make possible calculation of distribution of interstitial atoms and atom vacancies frozen into the silicon single crystal during melt growth of crystal. Thereby, it becomes possible to know the distribution of the aggomerates of interstitial atoms and atom vacancies formed during crystal growth, and densities and distribution of the grown-in defects nucleated and grown from the agglomerates.

That is to say, to achieve above described object, the present invention predicts the densities and distributions of grown-in defects which would appear during heat processing of a semiconductor wafer which is used for semiconductor device fabrication, by determining the densities and distribution of interstitial atoms and atom vacancies frozen into the crystal during melt growth of the silicon crystal from which the wafer is taken out on the basis of the temeprature distribution in the crystal and the crystal growth rate.

In particular, in accordance with the present invention, the density and distribution of crystal defects in the above described wafer are obtained from a first diffusion equation representing a change with time in concentration of interstitial atoms in the crystal as a function of the position in the crystal and a second diffusion equation representing a change with time in concentration of atom vacancies in the crystal as a function of the position in the crystal. The first diffusion equation includes a term representing contribution of ordinary diffusion of interstitial atoms to the change with time in concentration of interstitial atoms in the crystal, a term representing contribution of uphill diffusion of interstitial atoms to the change with time in concentration of interstitial atoms in the crystal, and a term representing contribution of pair annihilation reaction between interstitial atoms and atom vacancies to the change with time in concentration of interstitial atoms in the crystal. The second diffusion equation includes a term representing contribution of ordinary diffusion of atom vacancies to the change with time in concentration of atom vacancies in the crystal, a term representing contribution of uphill diffusion of atom vacancies to the change with time in concentration of atom vacancies in the crystal, and a term representing contribution of pair annihilation reaction between interstitial atoms and atom vacancies to the change with time in concentration of atom vacancies in the crystal.

The term "ordinary diffusion" refers to diffusion dependent upon the concentration gradient of interstitial atoms or atom vacancies in the crystal. The term "uphill diffusion" refers to diffusion of interstitial atoms and atom vacancies toward the crystal growth interface dependent upon the temperature gradient in the crystal. Details thereof are described in R. Habu, I. Yunoki, T. Saito and A. Tomiura, Jpn. J. Appl. Phys., 32 (April 1993), p. 1740; R. Habu, K. Kojima, H. Harada, and A. Tomiura, Jpn. J. Appl. Phys., 32 (April 1993), p. 1747; and R. Habu, K. Kojima, H. Harada, and A. Tomiura, Jpn. J. Appl. Phys., 32 (April 1993), p. 1754. Furthermore, the term "pair annihilation reaction" refers to reaction in which an interstitial atom and atom vacancy disappear due to recombination of them.

BRIEF DESCRIPTION OF DRAWINGS

FIG. 5b is a photograph of 200 magnifications showing an enlarged view of OSF defects observed in the wafer as shown in FIG. 5a;

BEST MODE FOR CARRYING OUT THE INVENTION

Figure 1:
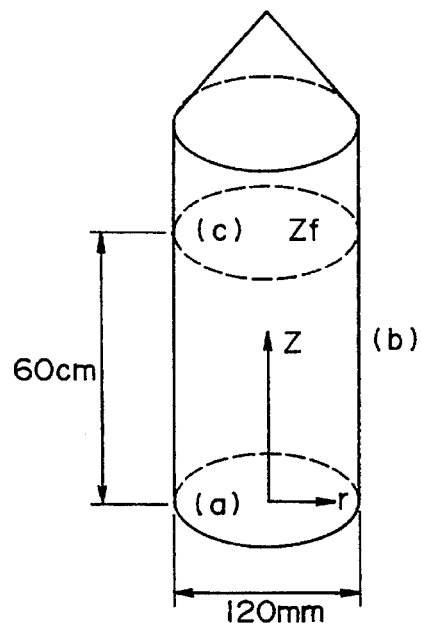
FIG. 1 is a diagram showing the shape of a silicon single crystal obtained from a silicon melt, to which a method of the present invention is applied.

In one embodiment of the present invention, the following equations (1) and (2) are used as the above described first and second diffusion equations.

$$\frac{\partial N_I}{\partial t} + v(t)\frac{\partial N_I}{\partial z} = \quad (1)$$

$$div(D_I \text{grad} N_I) - div\left\{\left(\frac{D_I \epsilon_I}{RT^2} \text{grad} T\right)N_I\right\} -$$

$$4\pi(D_I + D_V)R_c N_I N_v \exp\left(-\frac{\Delta G}{RT}\right)\frac{RT}{E_F} \ln \frac{N_I N_v}{N_I^{eq} N_v^{eq}}$$

$$\frac{\partial N_v}{\partial t} + v(t)\frac{\partial N_v}{\partial z} = \quad (2)$$

$$div(D_v \text{grad} N_v) - div\left\{\left(\frac{D_v \epsilon_v}{RT^2} \text{grad} T\right)N_v\right\} -$$

$$4\pi(D_I + D_V)R_c N_I N_v \exp\left(-\frac{\Delta G}{RT}\right)\frac{RT}{E_F} \ln \frac{N_I N_v}{N_I^{eq} N_v^{eq}}$$

In the equations (1) and (2), symbols in the following list are used.

t: time, sec
v(t): crystal growth rate (=crystal pulling rate), cm/sec
z: coordinate taken along the crystal axis having its origin at the crystal growth interface, cm
$N_I$: density of interstitial atoms in the silicon crystal, atoms/cm$^3$
$N_I^{eq}$: thermal equilibrium density of interstitial atoms in the silicon crystal, atoms/cm$^3$
$N_V$: density of atom vacancies in the silicon crystal, atoms/cm$^3$
$N_V^{eq}$: thermal equilibrium density of atom vacancies in the silicon crystal, atoms/cm$^3$
$D_I$: diffusion coefficient of interstitial atoms in the silicon crystal, cm$^2$/sec
$D_V$: diffusion coefficient of atom vacancies in the silicon crystal, cm$^2$/sec
R: gas constant, cal/mol
$\epsilon_I$: sum of generation enthalpy of interstitial atoms and heating enthalpy of interstitial atoms, cal/mol
$\epsilon_v$: sum of generation enthalpy of atom vacancies and heating enthalpy of atom vacancies, cal/mol
$E_F$: energy released by reaction between interstitial atoms and atom vacancies, cal/mol
T temperature, K
$R_C$: critical distance between interstitial atoms and atom vacancies within which the reaction between them can occur, cm
$\Delta G$: energy necessary to activate the reaction between interstitial atoms and atom vacancies, cal/mol In any of the CZ-method and the FZ-method, the silicon single crystal is produced by pulling up or pulling down a silicon crystal from a silicon melt of high temperature using a seed crystal in the vertical direction (z-axis direction) while rotating the silicon melt around the z axis thereby growing a cylindrical silicon single crystal having the z axis as the central axis. Therefore, concentration values of interstitial atoms and atom vacancies in the cylindrical single crystal change as a function of the height z in the center axis direction and the radial distance r from the center of the cylinder, while, the concentration values are rotationally symmetric with respect to the rotation axis, i.e., the center axis of the cylinder. By solving the above described equations (1) and (2), values of $N_I$ and $N_V$ are obtained as a function of z and r. Therefore, the concentration distributions of interstitial atoms and atom vacancies of a circular wafer cut out at a height z are obtained as a function of r.

For solving equations (1) and (2), it is first necessary to know the temperature distribution and temperature gradient distribution in the crystal. These values are obtained from the following equation (3).

$$\frac{\partial T}{\partial t} + v(t)\frac{\partial T}{\partial z} = div(\kappa \text{grad} T) \quad (3)$$

In equation (3), κ is a diffusion coefficient of heat (cm$^2$/sec) of silicon.

As for the temperature distribution and temperature gradient distribution in the crystal, a change of crystal growth rate during crystal pulling largely affects the density and distribution of grown-in defects. Because a change in the crystal growth rate changes the temperature distribution in the vicinity of the crystal growth end and the shape of the crystal growth end, which in turn exert great influence upon diffusion of interstitial atoms and atom vacancies. Strictly speaking, therefore, the temperature distribution in the crystal must be calculated by solving the moving boundary problem and as time dependent solution.

For calculating the heat radiations from the crystal surface and furnace components such as a heater and a furnace wall and the heat transfer due to flow of the semiconductor melt during crystal pulling, a very long calcuation time is needed. Therefore, a heat model which reflects thermal characteristics of respective crystal pulling furnaces can be adopted to shorten the calculation time.

Then, by numerically solving diffusion equations represented by equations (1) and (2) in the temperature field in the crystal, the distributions of interstitial atoms and atom vacancies frozen into the crystal are calculated. In order to evaluate how the distributions of interstitial atoms and atom vacancies depend upon a change in crystal growth rate, a time dependent solution must be obtained.

The calculation of the distribution of interstitial atoms and atom vacancies must cover at least a range from z=0 to z=$z_f$. Where, at z=0 (crystal growth end) the temperature of the crystal is equall to its melting point, and at z=$z_f$, diffusion rates of both interstitial atoms and atom vacancies become sufficiently slow and interstitial atoms and atom vacancies can be regarded as frozen into the crystal. By letting the range of numerical calculation of equations (1) and (2) be from z=0 to z=$z_f$, the concentration distribution of interstitial atoms and atom vacancies finally remaining (frozen) in the crystal can be derived. Of course, it is ideal that the temperature field of the entire crystal is given over the entire process of crystal growth and the range of calculation covers the entire crystal (cone to tail).

As shown in FIG. 1, the silicon single crystal takes the shape of a cylinder having the z axis as the center axis. As described before, calculations of equations (1) and (2) are made for the range from z=0 to z=$z_f$. In case the calculation range of the diffusion equations is limited to a part of the crystal, there exist boundary conditions for the calculation on a growth interface a at z=0, a crystal surface b, and a boundary face c at z=$z_f$, as shown in FIG. 1. The boundary conditions a, b and c are given by the following equations (4), (5) and (6).

(a) $N_I(Tm) = N_I^o \exp\left(-\frac{\epsilon_I}{RT_m}\right)$ (4)

$N_v(Tm) = N_v^o \exp\left(-\frac{\epsilon_v}{RT_m}\right)$ (b) $N_I = N_I^o \exp\left(-\frac{\epsilon_I}{RT}\right)$ (5)

$N_v = N_v^o \exp\left\{-\frac{\epsilon_v}{RT}\right\}$ (c) $\left(\frac{\partial N_I}{\partial z}\right)_{z_f} = 0$ (6)

$\left(\frac{\partial N_v}{\partial z}\right)_{z_f} = 0$

In these equations $N_I^o$ and $N_v^o$ are constants and Tm is a freezing temperature of silicon.

The reason why the calculation is conducted in a range of z=0 to z=$z_f$ is that the distribution of the interstitial atom density and the atom vacancy density in each section are influenced by the history of single crystal growth in that section. That is to say, in the section of the single crystal at z=$z_f$, the final tissue is determined as a result of crystal growth made during movement from the position z=0 to the position z=$z_f$. For deriving the distribution of the interstitial atom density and the atom vacancy density in the section of z=$z_f$, therefore, the calculation range of equations (1) and (2) must cover at least a range of z=0 to z=$z_f$. On the growth interface (a) and the crystal surface (b) of FIG. 1, concentration values of interstitial atoms and atom vacancies are considered to be their thermal equilibrium concentration values. At the boundary (c), transportation of interstitial atoms and atom vacancies caused by movement (growth) of the crystal in the direction of the z axis predominates the diffusion of interstitial atoms and atom vacancies. Therefore, the concentration gradients of interstitial atoms and atom vacancies in the z-axis direction disappear.

In case the calculation range covers the entire crystal, the conditions of the boundaries (a) and (b) can be adopted while the crystal is in contact with the melt whereas the condition of the boundary (b) can be adopted after the crystal has left the melt.

The interstitial atoms and atom vacancies frozen into the crystal during crystal growth agglomerate and generate nuclei of grown-in defects. Therefore, if the concentration distributions of interstitial atoms and atom vacancies frozen into the crystal are known, the type and density of grown-in defects can be predicted.

Figure 2:
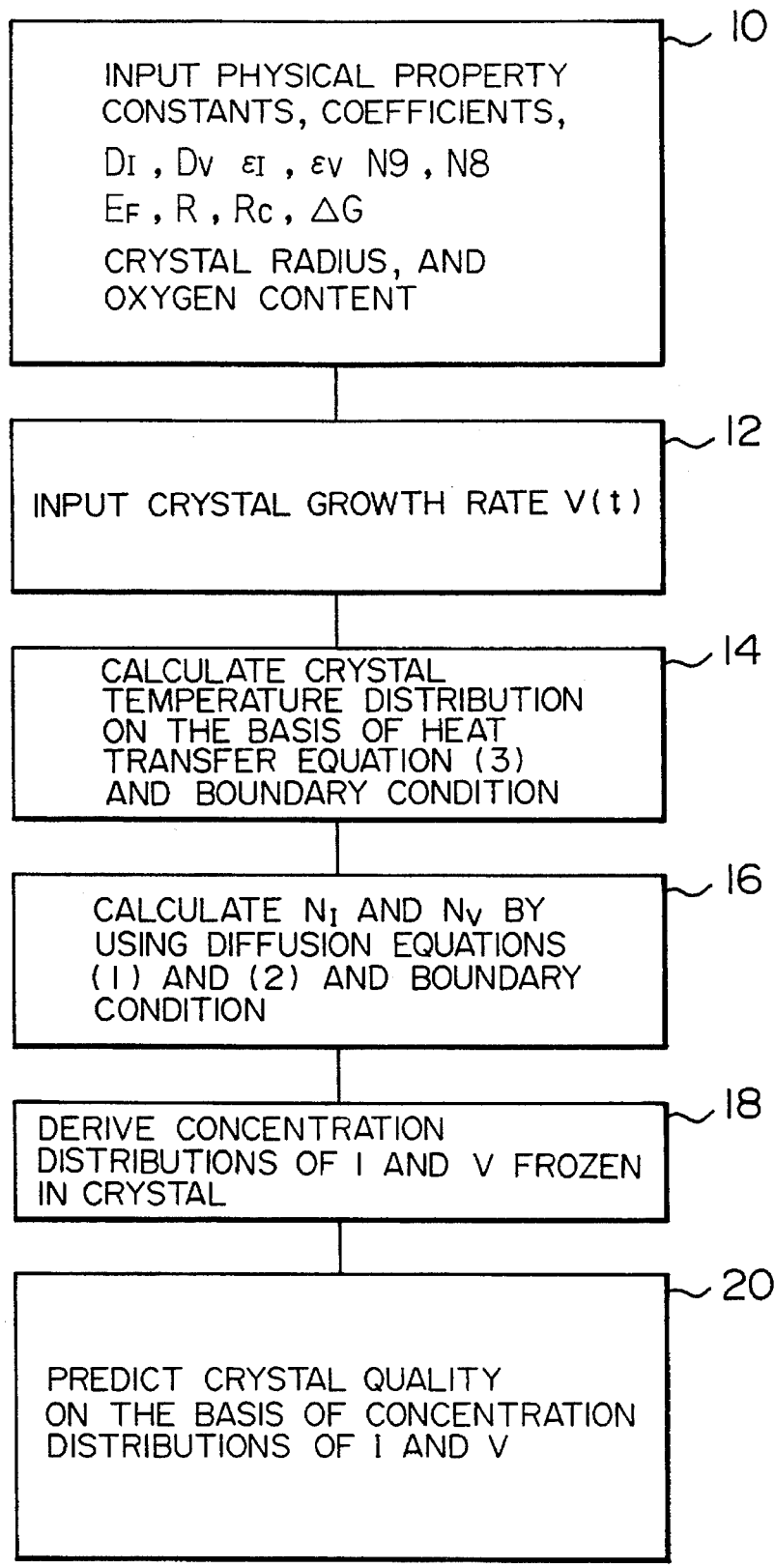
FIG. 2 is a flow chart for explaining one embodiment of a method according to the present invention.

FIG. 2 is a flow chart showing the process heretofore described. That is to say, various constants, coefficients, and other data to be used in computation of equations (1) to (6) are first inputted to a computer via an input device such as a keyboard (step 10). As for the growth rate of the crystal, i.e., the pulling rate of the crystal, the value obtained by measuring it in actual work is inputted (step 12). Or by regarding the pulling rate of the crystal during work as constant, the pulling rate determined before the start of work may be inputted along with the above described various constants via the keyboard at step 10. Then the boundary conditions for the crystal can be derived by solving equation (3) (step 14). On the basis of the boundary condition, computations of equations (1) and (2) are made and concentration distributions of interstitial atoms I and atom vacancies V frozen in the crystal are derived as a function of the position z in the crystal (step 16). On the basis of concentration distributions of I and V in a selected position z, the crystal quality of a wafer taken out at the position z is predicted (step 20).

Figure 3:
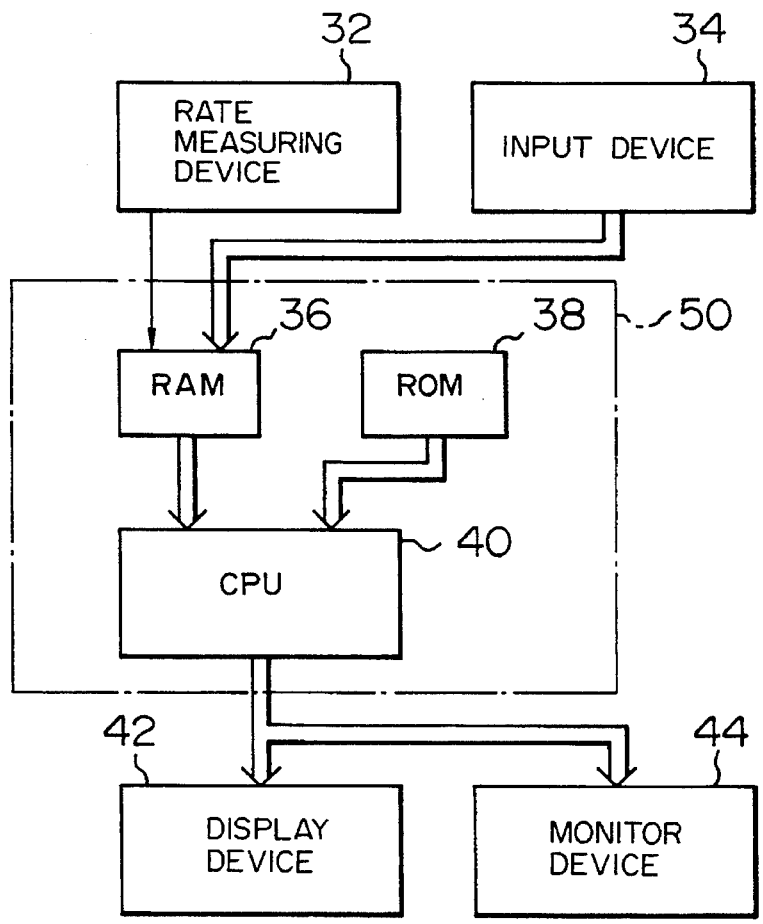
FIG. 3 is a diagram showing the configuration of an apparatus for implementing the method of the present invention.

An example of an apparatus for implementing the process heretofore described is shown in FIG. 3. Data such as various constants and coefficients are inputted to a computer 50 via an input device 34 such as a keyboard. Furthermore, the pulling rate of the crystal is measured by a rate measuring device 32 provided in a crystal producing apparatus and supplied to the computer 50. The computer 50 includes a RAM for storing data such as the above described various inputted constants and pulling rate of the crystal, a ROM for storing calculation program of equations (1) to (6), and a computing device CPU 40 for computing equations (1) and (6) according to the program stored in the ROM by using the data stored in the RAM and deriving concentration distributions of interstitial atoms I and atom vacancies in the crystal. The concentration distributions of interstitial atoms and atom vacancies in the crystal calculated by the CPU are displayed on a display device 42 or transmitted to an external monitor device 44 so that they may be used to predict crystal defects occurring in the wafer.

There will now be described calculation results as to concentration distributions of interstitial atoms and atom vacancies in the crystal obtained by applying the method of the present invention to production of a silicon single crystal using the CZ method.

For numerical calculations of equations (1) to (3), a method such as FEM or difference method can be used. There will now be shown an example of concentration distribution of interstitial atoms and atom vacancies frozen into tile crystal as calculated according to the difference method using the control volume technique on the basis of the temperature distribution in the crystal and the result value of crystal growth rate, and an example of prediction of grown-in defects on the basis of the result of the calculation.

As for coordinates for calculating the temperature distribution in the crystal and distribution of interstitial atoms and atom vacancies, cylindrical coordinates were used because the crystal was formed in a cylindrical form when it was pulled and grown. A difference mesh was used in common for calculations of both the temperature distribution and distributions of interstitial atoms and atom vacancies frozen into the crystal.

By using such a technique as to minimize the mesh in the vicinity of the crystal growth end, regard the silicon melt as a heat conducting body regardless of its flow, and let a position where its temperature is equal to the melting point be a solidification (growth) interface, changes of the shape of the crystal growth interface and temperature distribution in the vicinity of crystal growth end due to a change in crystal growth rate were calculated.

For calculating the temperature distribution in the crystal, it is necessary to known the heat balance on the crystal surface during crystal pulling as the boundary condition. For accurately presuming the heat transfer on the crystal surface by means of calculation, a very long time is needed for calculation of thermal radiation, for example, in the crystal pulling furnace. Therefore, a specific CZ crystal pulling furnace was selected beforehand, and a silicon crystal having a diameter of five inches was used. Temperature of such a crystal during crystal pulling was actually measured at a plurality of points, and the distribution of heat radiation from the crystal surface during growth was derived therefrom. By adopting this distribution of heat radiation as the boundary condition at the crystal surface, temperature of each lattice point was derived. In this method, only the crystal heat history in a specific crystal growing furnace can be calculated. However, this method has an advantage that diffusion simulation of interstitial atoms and atom vacancies in consideration of the thermal characteristic of each furnace can be performed with heat calculation made in a short time. Discretization of the heat transfer equation (3) was done by using a technique described by S. V. Patankar, in Numerical Heat Transfer and Fluid, 1980, Hemisphere Pub. Co. McGraw-Hill Book Company.

As for the diffusion equations (1) and (2), calculations were made by using the same calculation mesh as the calculation of equation (3) and its calculation result. Discretization of the diffusion equations (1) and (2) was done by using a technique described by S. Selberherr, in Analysis and Simulation of Semiconductor Device, Springer Verlag, Wien New York, 1984. For numerical solution of nonlinear simultaneous differential equations, there was used the recursive method as described in "Decoupled method" in "Semiconductor device design simulator" written by Hideki Koike, Yoshikane Ishii, Chiemi Nagano, Takashi Matsubara, and Noboru Masumori, edited by Fuji Synthetic Laboratory, and published by Maruzen, 1991, pp. 17 to 87.

Figure 4:
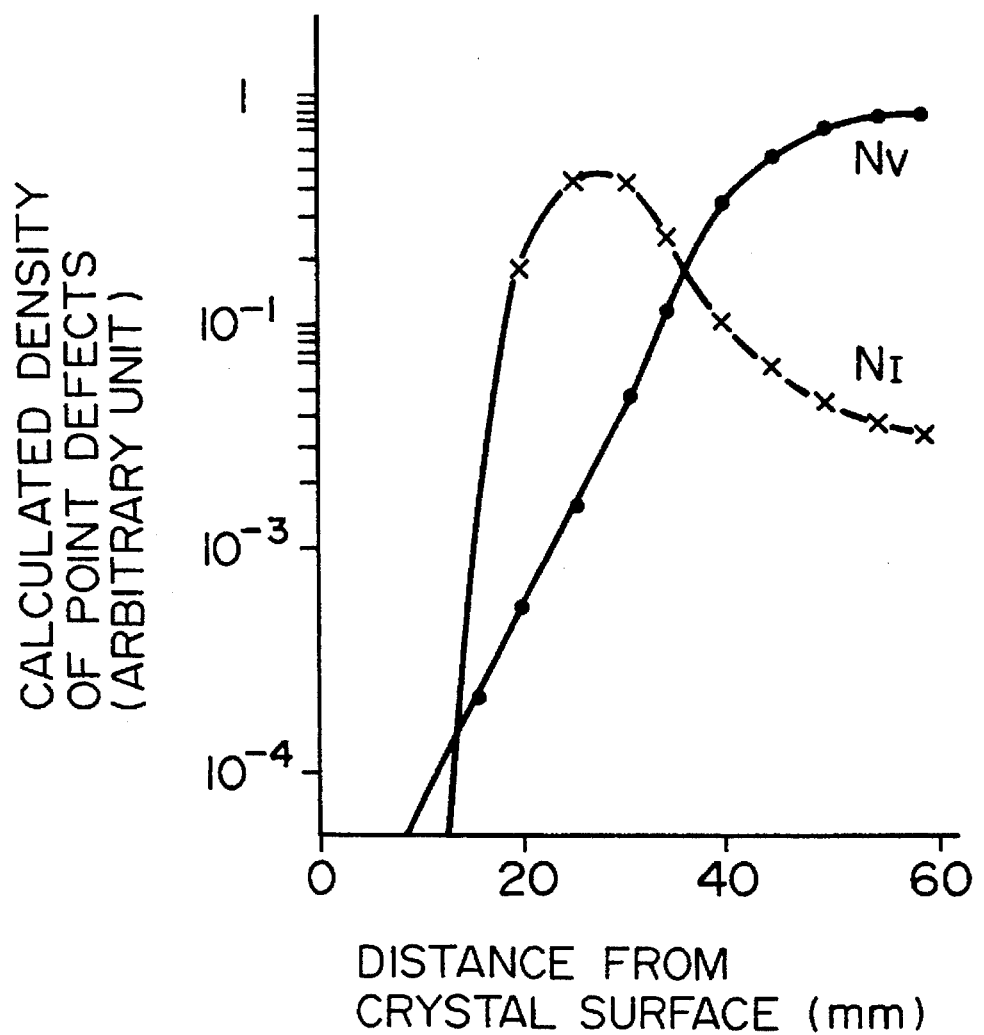
FIG. 4 is a diagram showing the density distributions of interstitial atoms and atom vacancies in one section perpendicular to the z axis of a silicon single crystal calculated by the method of the present invention.

As to interstitial atoms and atom vacancies frozen in a cylindrical single crystal having a diameter of 130 mm grown at a growth rate of 0.1 cm/minute, FIG. 4 shows distributions of density $N_I$ of interstitial atoms and density $N_V$ of atom vacancies on the section (c) perpendicular to the z axis and located at $z=z_f$. As described before, $N_I$ and $N_V$ are distributed in the crystal so as to be rotationally symmetric with respect to the cylinder axis z. In the same section, therefore, values of $N_I$ and $N_V$ are equal in principle provided that the distances (depths) from the crystal surface are equal. In FIG. 4, therefore, the value of each of $N_I$ and $N_V$ is shown as a function of the distance from the crystal surface on the above described section. Since the diameter of the single crystal is 130 mm, the position at 65 mm from the crystal surface coincides with the position of the center axis z of the crystal.

Furthermore, in calculations of FIG. 4, temperature T in equations (1) and (2) is derived by means of calculation by experimentally forming a calculation equation with respect to the heating and radiation condition of the furnace and the crystal pulling rate.

As for $D_I$, $D_V$, $\epsilon_I$, $\epsilon_V$, $N_I^o$ and $N_I^o$, values determined experimentally beforehand were used. The following values were used in the embodiment.

$$N_I^{eq} = N_I^o \times \exp\left(\frac{-1012000}{RT}\right) \text{atms/cm}^3$$

$$N_V^{eq} = N_V^o \times \exp\left(\frac{-92000}{RT}\right) \text{atoms/cm}^3$$

$$D_I = 4.84 \times 10^5 \times \exp\left(\frac{-64400}{RT}\right) \text{cm}^2/\text{sec}$$

$$D_V = 0.0437 \times \exp\left(\frac{10350}{RT}\right) \text{cm}^2/\text{sec}$$

$$R = 1.986 \text{ cal/(mol} \cdot \text{k)}$$
$$E_F = 253 \text{ kcal/mol}$$
$$R_c = 10^{-7} \text{ cm}$$

$$\Delta G = RT \times \left\{ 2.0 + 13.0 \ln\left(\frac{T}{570}\right) \right\} \text{cal/mol}$$

$$\epsilon_I = 1012000 \text{ cal/mol}$$
$$\epsilon_v = 92000 \text{ cal/mol}$$
$$N_I^o = 1.244 \times 10^{30}$$
$$N_v^o = 8.02 \times 10^{29}$$

FIG. 4 shows an example of calculation of distributions of interstitial atoms and atom vacancies frozen in the crystal grown at a growth rate of 0.1 cm/minute (distributions at $z=z_f$).

Figure 5A:
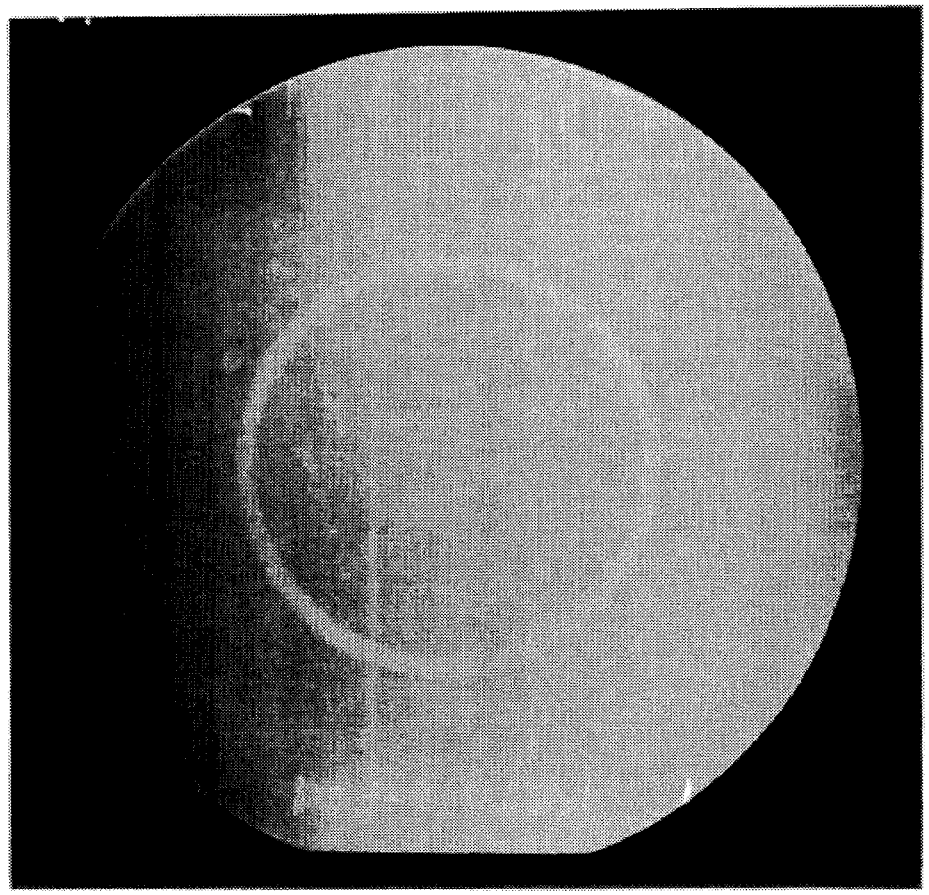
FIG. 5a is an X-ray photograph (X-ray topograph) of actual size (i.e. of one magnification) showing the distribution of grown-in defects in a single crystal wafer sliced from a silicon single crystal which was formed under the same growth condition as that of the silicon single crystal used for the calculation of FIG. 4.
Figure 5B:
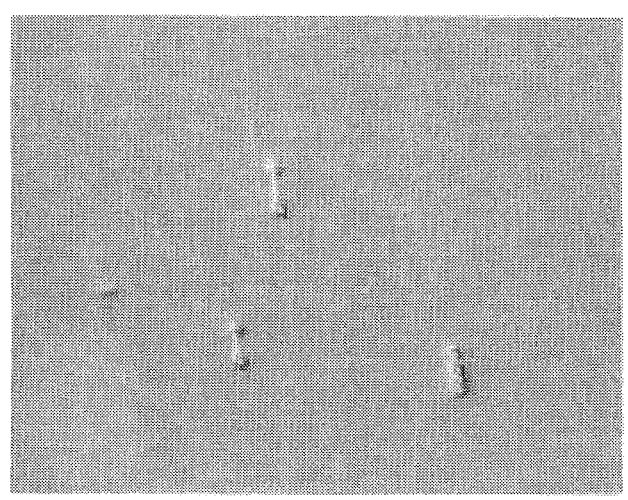

In order to obtain the distribution of heat radiation from the crystal surface and compare it with the calculation result, a five-inch single crystal was grown in the crystal growing furnace in which temperature of the crystal had been actually measured during crystal pulling. The crystal growth rate was set to 0.1 cm/minute which was the same as that used in the calculation of FIG. 4. In the grown single crystal, a wafer was picked from a region which grew stably at a rate of 0.1 cm/minute. This wafer was subjected to heat treatment under the condition of 1100° C.×80 minutes (wet $O_2$), and then an X-ray photograph was taken. Photographs taken are shown in FIGS. 5a and 5b. FIG. 5a shows the entire wafer. FIG. 5b is an enlarged view of a portion in which OSFs (oxidation induced stacking faults) occurred. As shown in FIG. 5a, oxidation induced stacking faults are observed in a ring form in the photograph taken by the X-ray topograph. By comparing FIG. 4 with FIG. 5a, it will be appreciated that the ring-shaped oxidation induced stacking faults occur in the peak position of the distribution $N_I$ of interstitial atoms in the result of calculation shown in FIG. 4.

Figure 6:
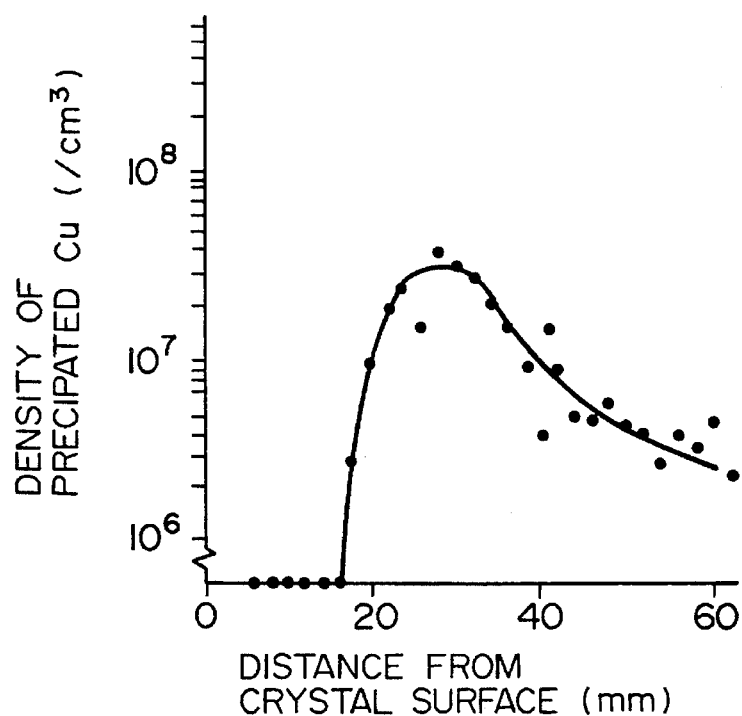
FIG. 6 is a diagram showing the distribution of defects in the single crystal wafer at a section, which corresponds to the section in FIG. 4, sliced from the silicon single crystal pulled and growth under the same condition as that of the silicon single crystal used in the calculation of FIG. 4. The defects were observed by using the Cu decoration method.

The density distribution, in the radial direction of the crystal, of micro defects existing, in an as grown wafer which has OSFs (oxidation induced stacking faults) as shown in FIG. 5a was observed by using the Cu decoration method. The result of observation is shown in FIG. 6. By comparing this with FIG. 4, it is recognized that the density distribution of minute defects shown in FIG. 6 and the distribution $N_I$ of interstitial atoms shown in FIG. 4 agree with each other well. In addition, the ring of oxidation induced stacking faults found in the photograph of the X-ray topograph as shown in FIG. 5a is located at the peak position of the density distribution of minute defects. These observations indicate that the ring of oxidation induced stacking faults occurs in a region where the concentration of interstitial atoms exceeds a certain critical value.

Figure 7:
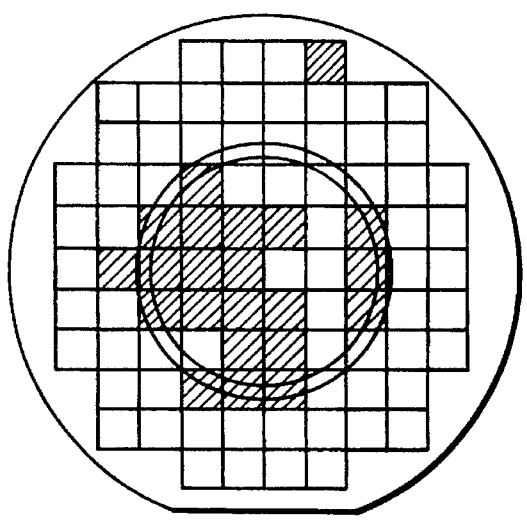
FIG. 7 is a diagram showing the distribution of breakdown voltage of an oxide film of a wafer obtained under substantially the same condition as that of the wafer of FIG. 6.

FIG. 7 shows distribution of breakdown voltage of the oxide film on the surface of the wafer used for observation of FIGS. 5a and 6. It is shown that an area having poor breakdown voltage of the oxide film exists inside the ring of oxidation induced stacking faults and the region outside the ring of oxidation induced stacking faults has high breakdown voltage of the oxide film. By comparing this with the calculation result of FIG. 4, it is known that an area having a high concentration of atom vacancies $N_V$ frozen in the crystal is degraded in breakdown voltage of the oxide film and the outer periphery portion having low concentration values of interstitial atoms and atom vacancies is high in breakdown voltage of the oxide film. The breakdown voltage of the oxide film was classified to be good when $E_{breakdown} \geq 7.5$ MV/cm, and it was classified to be bad when $E_{breakdown} < 7.5$ MV/cm.

As for points defects frozen into the crystal during crystal pulling, concentration distributions of interstitial atoms and atom vacancies are derived by numerically solving the diffusion equations (1) and (2) respectively of interstitial atoms and atom vacancies. On the basis of the distributions thus calculated, the type of grown-in defects in the CZ silicon single crystal and the position in the crystal radius where those grown-in defects appear are predicted. As heretofore described, results of the prediction agree well with results of actual measurements concerning oxidation induced stacking faults, micro defects, and breakdown voltage of the oxide film on the wafer surface.

As for FZ crystals, it is known that the swirl defects appear in a region having a high concentration of interstitial atoms and D defects develop in a region having a high concentration of atom vacancies as described by Takao Abe, in "Applied Physics" 59 (1990), p. 272. In the same way as CZ crystals, the kind of growth defects and distribution thereof can be predicted.

INDUSTRIAL APPLICABILITY

Concentration distributions of interstitial atoms and atom vacancies frozen in a melt grown, silicon single crystal are derived by solving the diffusion equations of interstitial atoms and atom vacancies during crystal pulling. On the basis of result of the calculation, the type of grown-in defects and the position where the grown-in defects appear in the silicon single crystal can be predicted. Thereby the following merits can be expected:

(1) reduction of the number of quality check tests; and (2) prediction of crystal quality (grown-in defects, tendency of oxide precipitation, distribution of breakdown voltage of the oxide film, and so on) of each crystal growing furnace.

Conventionally, prediction of wafer quality has been made statistically by accumulating a large amount of actual data concerning correlation between the crystal pulling condition and wafer quality. By using the theoretical technique according to the present invention in combination with the actual data, reduction of the number of data and improvement in precision of the prediction become possible.

I claim:

1. A method of predicting density and distribution of crystal defects that would appear in a semiconductor wafer during heat treatment processes thereof on the basis of respective densities and distributions of interstitial atoms and atom vacancies frozen, during crystal growth, into a semiconductor single crystal which is used as a raw material for said semiconductor wafer, in a section of said semiconductor single crystal corresponding to said semiconductor wafer, said method comprising the steps of:

obtaining a temperature of the material during crystal growth, which temperature is variable as a function of time and location in the crystal as grown, based on a heat-transfer equation; and deriving said respective densities and distributions of interstitial atoms and atom vacancies under a condition of the temperature as obtained from a first diffusion equation representing a change with time in concentration of interstitial atoms in the semiconductor single crystal in the course of growth from a melt as a function of a position in the crystal and a second diffusion equation representing a change with time in concentration of atom vacancies in said crystal as a function of a position in the crystal, said first diffusion equation including a term representing contribution of ordinary diffusion of interstitial atoms to the change with time in concentration of interstitial atoms in the crystal, a term representing contribution of uphill diffusion of interstitial atoms to the change with time in concentration of interstitial atoms in the crystal, and a term representing contribution of pair annihilation reaction between interstitial atoms and atom vacancies to the change with time in concentration of interstitial atoms in the crystal, said second diffusion equation including a term representing contribution of ordinary diffusion of atom vacancies to the change with time in concentration of atom vacancies in the crystal, a term representing contribution of uphill diffusion of atom vacancies to the change with time in concentration of atom vacancies in the crystal, and a term representing contribution of pair annihilation reaction between interstitial atoms and atom vacancies to the change with time in concentration of atom vacancies in the crystal.

2. A method according to claim 1, wherein said first diffusion equation, said second diffusion equation and said heat-transfer equation are defined by the following equations (1), (2) and (3), respectively:

$$\frac{\partial N_I}{\partial t} + v(t)\frac{\partial N_I}{\partial z} = \qquad (1)$$

$$div(D_I \text{grad} N_I) - div\left\{ \left(\frac{D_I \epsilon_I}{RT^2} \text{grad} T\right) N_I \right\} -$$

$$4\pi(D_I + D_V)R_c N_I N_v \exp\left(-\frac{\Delta G}{RT}\right)\frac{RT}{E_F} \ln\frac{N_I N_v}{N_I^{eq} N_v^{eq}}$$

$$\frac{\partial N_v}{\partial t} + v(t)\frac{\partial N_v}{\partial z} = \qquad (2)$$

$$div(D_v \text{grad} N_v) - div\left\{ \left(\frac{D_v \epsilon_v}{RT^2} \text{grad} T\right) N_v \right\} -$$

$$4\pi(D_I + D_V)R_c N_I N_v \exp\left(-\frac{\Delta G}{RT}\right)\frac{RT}{E_F} \ln\frac{N_I N_v}{N_I^{eq} N_v^{eq}}$$

$$\frac{\partial T}{\partial t} + v(t)\frac{\partial T}{\partial z} - (k \text{ grad } T) \qquad (3)$$

wherein t: time, sec v(t): crystal growth rate (=crystal pulling rate), cm/sec z: taken along the crystal axis having its origin at the crystal growth interface, cm $N_1$: density of interstitial atoms in the silicon crystal, atoms/cm$^3$ $N^{eq}_1$: thermal equilibrium density of interstitial atoms in the silicon crystal, atoms/cm$^3$ $N_V$: density of atom vacancies in the silicon crystal, atoms/cm$^3$ $N^{eq}_V$: thermal equilibrium density of atom vacancies in the silicon crystal, atoms/cm$^3$ $D_1$: diffusion coefficient of interstitial atoms in the silicon crystal, cm$^2$/sec $D_V$: diffusion coefficient of atom vacancies in the silicon crystal, cm$^2$/sec R: gas constant, cal/mol $\epsilon_1$: sum of generation enthalpy of interstitial atoms and heating enthalpy of interstitial atoms, cal/mol $\epsilon_V$: sum of generation enthalpy of atom vacancies and heating enthalpy of atom vacancies, cal/mol $E_F$: energy released by reaction between interstitial atoms and atom vacancies, cal/mol T: temperature, K $R_C$: critical distance between interstitial atoms and atom vacancies within which the reaction between them can occur, cm $\Delta G$: energy necessary to activate the reaction between interstitial atoms and atom vacancies, k: diffusion coefficient of heat (cm$^2$/sec) of the crystal material.

* * * * *